(12) United States Patent
Tabe

(10) Patent No.: US 7,998,760 B2
(45) Date of Patent: Aug. 16, 2011

(54) MANUFACTURE METHOD FOR PHOTOVOLTAIC MODULE INCLUDING INSPECTION AND REPAIR

(75) Inventor: Tomonori Tabe, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/728,831

(22) Filed: Mar. 22, 2010

(65) Prior Publication Data

US 2010/0240153 A1    Sep. 23, 2010

(30) Foreign Application Priority Data

Mar. 23, 2009 (JP) ................................. 2009-070747

(51) Int. Cl.
*H01L 21/66* (2006.01)
*H01L 21/00* (2006.01)

(52) U.S. Cl. ............. 438/15; 438/66; 438/118; 136/290

(58) Field of Classification Search .................. 136/290
See application file for complete search history.

(56) References Cited

U.S. PATENT DOCUMENTS

| | | | | | |
|---|---|---|---|---|---|
| 3,094,439 | A | * | 6/1963 | Mann et al. | 136/244 |
| 3,502,507 | A | * | 3/1970 | Mann | 136/244 |
| 4,057,439 | A | * | 11/1977 | Lindmayer | 136/251 |
| 4,210,462 | A | * | 7/1980 | Tourneux | 136/251 |
| 4,301,322 | A | * | 11/1981 | Amick | 136/256 |
| 4,321,418 | A | * | 3/1982 | Dran et al. | 136/251 |
| 4,322,261 | A | * | 3/1982 | Dubois | 156/280 |
| 4,336,648 | A | * | 6/1982 | Pschunder et al. | 438/64 |
| 4,419,530 | A | * | 12/1983 | Nath | 136/251 |
| 4,433,200 | A | * | 2/1984 | Jester et al. | 136/251 |
| 4,481,378 | A | * | 11/1984 | Lesk | 136/244 |
| 4,542,258 | A | * | 9/1985 | Francis et al. | 136/256 |
| 4,636,578 | A | * | 1/1987 | Feinberg | 136/251 |
| 5,006,179 | A | * | 4/1991 | Gaddy | 136/244 |
| 5,011,544 | A | * | 4/1991 | Gaddy et al. | 136/246 |
| 5,133,810 | A | * | 7/1992 | Morizane et al. | 136/251 |
| 5,296,043 | A | * | 3/1994 | Kawakami et al. | 136/244 |
| 5,330,583 | A | * | 7/1994 | Asai et al. | 136/251 |
| 5,567,248 | A | * | 10/1996 | Chung | 136/244 |
| 5,660,646 | A | * | 8/1997 | Kataoka et al. | 136/251 |
| 5,998,729 | A | * | 12/1999 | Shiomi et al. | 136/251 |
| 6,156,967 | A | * | 12/2000 | Ralph et al. | 136/244 |
| 6,166,322 | A | * | 12/2000 | Chen et al. | 136/251 |
| 6,184,457 | B1 | * | 2/2001 | Tsuzuki et al. | 136/256 |
| 6,218,606 | B1 | * | 4/2001 | Morizane et al. | 136/251 |
| 6,262,358 | B1 | * | 7/2001 | Kamimura et al. | 136/244 |
| 6,369,316 | B1 | * | 4/2002 | Plessing et al. | 136/251 |
| 6,407,327 | B1 | * | 6/2002 | Ralph et al. | 136/244 |

(Continued)

*Primary Examiner* — Scott B Geyer

(74) *Attorney, Agent, or Firm* — Ditthavong Mori & Steiner, P.C.

(57) ABSTRACT

After overlaying a conductive adhesive film and the wiring material on an electrode of a solar cell and temporarily fixing the wiring material to the solar cell by pressure bonding under first temperature/pressurizing condition, the quality of the temporarily fixed solar cell is inspected, a solar cell determined to be defective in the inspection step is removed and the defective solar cell is replaced with a non-defective solar cell. Then, the wiring material is temporarily fixed to the non-defective solar cell by pressure bonding the wiring material with the conductive adhesive film interposed therebetween, under the first temperature/pressurizing condition and the wiring materials are fixed to the solar cell by thermally setting the conductive adhesive film under second temperature condition to apply heat higher than the first temperature condition.

6 Claims, 11 Drawing Sheets

U.S. PATENT DOCUMENTS

| | | | |
|---|---|---|---|
| 6,479,744 B1 * | 11/2002 | Tsuzuki et al. | 136/256 |
| 6,586,271 B2 * | 7/2003 | Hanoka | 438/66 |
| 6,610,919 B2 * | 8/2003 | Ohkubo | 136/244 |
| 6,617,505 B2 * | 9/2003 | Shimada | 136/244 |
| 6,791,024 B2 * | 9/2004 | Toyomura | 136/251 |
| 6,809,250 B2 * | 10/2004 | Gerson | 136/244 |
| 6,984,804 B2 * | 1/2006 | Takeyama et al. | 219/121.85 |
| 7,049,803 B2 * | 5/2006 | Dorner et al. | 428/423.1 |
| 7,442,872 B2 * | 10/2008 | Umemoto | 136/251 |
| 2003/0029036 A1 * | 2/2003 | Gerson | 29/854 |
| 2007/0235077 A1 * | 10/2007 | Nagata et al. | 136/256 |
| 2009/0288697 A1 | 11/2009 | Shimizu et al. | |

* cited by examiner

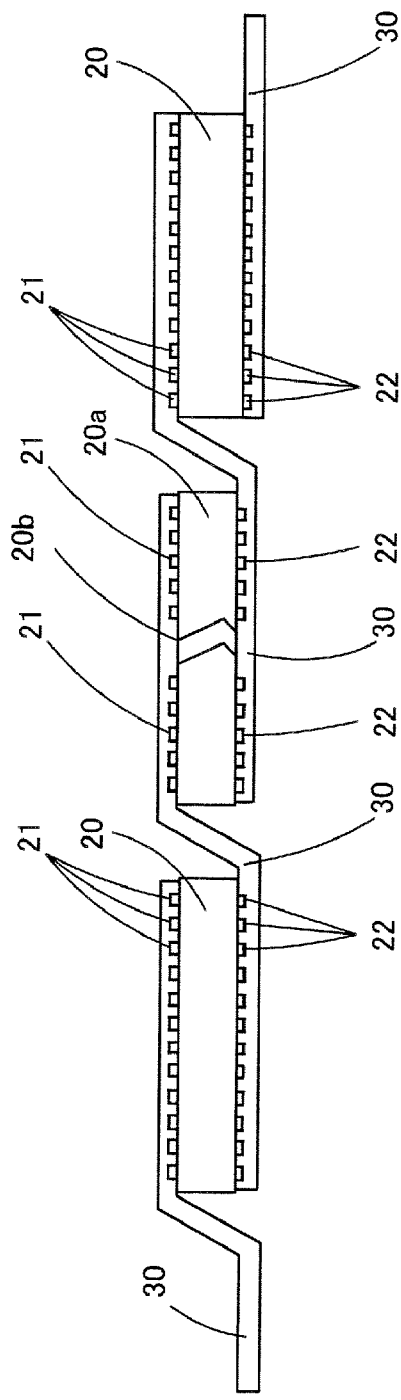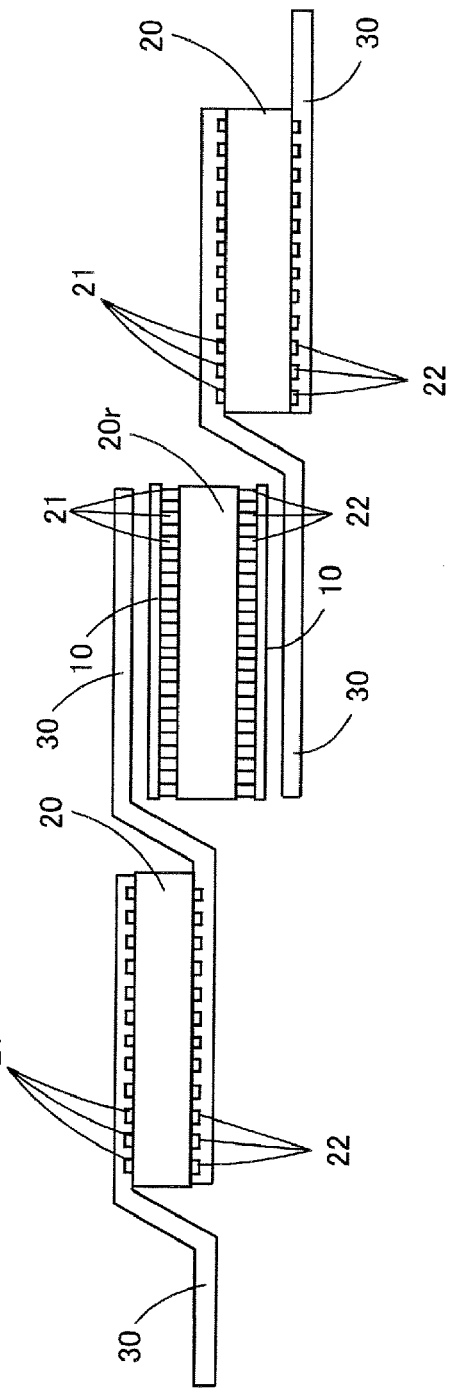
Fig.9 A
Fig.9 B under high temperature, high pressure conditions. The heater temperature is higher than a temperature at which the resin adhesive component is thermally set, namely 120° C. or above for example. The pressure is as high as 2 MPa. The wiring material 30 is pressed against the solar cell 20 while the resin adhesive component is thermally set so that the electrode 21, 22 of the solar cell 20 is connected with the wiring material 30. Thus, a string of solar cells is formed as shown in FIG. 16.

MANUFACTURE METHOD FOR PHOTOVOLTAIC MODULE INCLUDING INSPECTION AND REPAIR

The priority application Number JP2009-70747 upon which this patent application is based is hereby incorporated by reference.

BACKGROUND OF THE INVENTION

1. Field of the Invention

The present invention relates to a manufacture method for photovoltaic module.

2. Description of the Prior Art

A photovoltaic module has a construction wherein a plurality of solar cells are connected in series and/or in parallel by means of wiring members electrically connected to positive and negative electrodes thereof. In the manufacture of the photovoltaic module, the conventional practice is to use solder for connecting the electrodes of the solar cells with the wiring members. The solder is widely used because of its excellent connection reliability including conductivity, bonding strength and the like.

From an environmental standpoint and the like, on the other hand, the solar cells also employ a wiring connection method not relying on the solder. There is known a method, for example, which uses a conductive adhesive film to interconnect the solar cells and the wiring material. Such a method is disclosed in, for example, U.S. Patent Publication No. 2009/0288697A1.

As shown in FIG. 11, a connection structure using the conductive adhesive film is arranged such that an electrode 21, 22 of a solar cell 20, a conductive adhesive film 10 and a wiring material 30 are laminated on top of each other in this order. The conductive adhesive film 10 used herein comprises conductive particles 1 and a thermosetting resin adhesive component 2, as shown in FIG. 12.

The conductive adhesive film 10 is used for allowing the wiring material 30 to interconnect the electrodes 21, 22 of adjoining solar cells 20, 20 in series and/or in parallel.

An inventive method which uses the conductive adhesive film to interconnect the electrode of the solar cell and the wiring material is described with reference to FIG. 13 to FIG. 16. FIG. 13 is a schematic diagram showing a step in which the conductive adhesive film is pasted on the electrode of the solar cell. FIG. 14 is a schematic diagram showing a step of temporarily pressure bonding the wiring material to the solar cells. FIG. 15 is a schematic diagram showing a step of permanently pressure bonding the wiring material to the solar cell. FIG. 16 is a schematic diagram showing the wiring material fixed to the electrode of the solar cell.

First, as shown in FIG. 13, the conductive adhesive films 10, 10 are pasted on the electrodes 21, 22 of the solar cell 20. Subsequently, as shown in FIG. 14, the wiring material 30, 30 are respectively placed on upper and lower sides of the solar cell 20 having the conductive adhesive films 10, 10 pasted thereon and temporarily pressure bonded to the solar cell. The temporary pressure bonding is performed as follows. Heater blocks 40, 40 are pressed down on the solar cell at a low pressure of about 0.2 MPa, for example, so as to press the wiring material 30 against the solar cell 20. The temperature of the heater blocks 40, 40 is raised to about 90° C., for example, to provide low-temperature heating in which the resin adhesive component is not thermally set. The wiring materials 30, 30 are temporarily pressure bonded to the solar cell 20 by the low-temperature heating. Thus, the solar cells 20, 20 are set in array.

Next, the operation proceeds to a step of permanently pressure bonding the wiring material 30. As shown in FIG. 15, the arrayed solar cells 20, 20 having the wiring material 30 attached thereto are pressed by the heater blocks 40, 40 under high temperature, high pressure conditions. The heater temperature is higher than a temperature at which the resin adhesive component is thermally set, namely 120° C. or above for example. The pressure is as high as 2 MPa. The wiring material 30 is pressed against the solar cell 20 while the resin adhesive component is thermally set so that the electrode 21, 22 of the solar cell 20 is connected with the wiring material 30. Thus, a string of solar cells is formed as shown in FIG. 16.

Next, the string of solar cells thus fabricated is subjected to an inspection step in which the solar cell string is visually inspected to check for appearance and wiring so as to reject any defective solar cells. The photovoltaic module is formed using non-defective strings.

In the above manufacture process, the defective parts are mainly produced in the permanent pressure bonding step in which the solar cells are prone to fracture or cracks attributable to the pressure bonding. The production of a inferior part dictates the need to perform a repair work. The repair work is described with reference to FIG. 17A to FIG. 18C. FIG. 17A is a schematic diagram showing the repair work for defective solar cell or a state where a defective solar cell exists. FIG. 17B is a schematic diagram showing a state where the defective solar cell is removed. FIG. 18A is a schematic diagram showing a state where the defective solar cell exists. FIG. 18B is a schematic diagram showing a state where the defective solar cell is removed. FIG. 18C is a schematic diagram showing a state where the repair work for the defective solar cell is completed.

As shown in FIG. 17A to FIG. 18C, only a solar cell 20a suffering a facture or crack (20b) detected in the inspection step is removed and a new solar cell 20r is mounted in the vacant place. In the example shown in FIG. 17A, the central solar cell 20a includes the facture or crack (20b) and hence, an operation for removing the defective solar cell 20a is required.

However, a problem exists in a case where the conductive adhesive film 10 is used. Bonding strength between the thermally set resin adhesive component and the solar cell 20 is so strong that the wiring material 30 cannot be separated without being seriously deformed. If the fractured solar cell 20a is separated, as shown in FIG. 17B, the wiring material 30 may be deformed or a part of the thermally set resin adhesive component of the conductive adhesive film 10 or of the solar cell may stick to the wiring material 20. This makes it difficult to reuse the wiring material 30.

Hence, the repair work may be performed as shown in FIG. 18A to FIG. 18C. First, the solar cell 20a suffering the facture or crack (20b) detected in the inspection step is cut off from the string, as shown in FIG. 18A. For this purpose, the wiring materials 30, 30 on the fractured solar cell 20a are individually cut off at forward place (arrow A in the figure) and at rearward place (arrow B in the figure) on the lower side thereof as seen in the figure. After cutting off the wiring materials 30, 30, the fractured solar cell 20b with the wiring material 30 is bodily removed (see FIG. 18B). As shown in FIG. 18B, the wiring material 30 on the lower side of the forward solar cell 20 is severed at an end thereof. The wiring material 30 on the upper side of the rearward solar cell 20 is severed in the vicinity of an end of the forward solar cell 20.

Subsequently, a solar cell for repair 20r is prepared which has the wiring materials 30, 30 pressure bonded to the electrodes 21, 22 thereof by using the conductive adhesive film. In this example, the wiring material 30 on the upper side of the solar cell for repair 20r has a length to reach the wiring material 30 on the forward solar cell 20. The wiring material 30 on the lower side of the solar cell 20r is fixed to the solar cell 20r over a length sufficient for connection with the wiring material 30 extending from the upper side of the rearward solar cell 20.

As shown in FIG. 18C, the wiring material 30 of the solar cell for repair 20r and each corresponding one of the wiring materials 30, 30 of the string are interconnected at place (arrow C in the figure) by soldering. The repair work is completed by replacing the defective solar cell 20a with the non-defective solar cell 20r in this manner.

As described above, the wiring material cannot be reused because the bonding strength between the thermally set resin adhesive component of the conductive adhesive film and the solar cell is so strong. Accordingly, the repair work includes the steps of cutting off the wiring materials at the opposite ends of the solar cell suffering the fracture or crack, and soldering the wiring materials pressure bonded to the non-defective solar cell. This results in the decrease of throughput.

Further, the above-described repair method involves another problem that the soldered connection applies heat to the thermally set resin adhesive component of the non-defective solar cell, which is decreased in the bond strength to the wiring material.

SUMMARY OF THE INVENTION

It is an object of the invention to provide a method which permits the wiring material to be reused in the repair work so as to achieve productivity improvement and cost reduction.

Another object of the invention is to prevent the repair work from reducing the bond strength to the wiring material.

In accordance with one aspect of the invention, a manufacture method for photovoltaic module which includes a step of applying a resin adhesive to an electrode of a solar cell for electrically connecting a wiring material to the electrode, comprises: a step of overlaying the resin adhesive and the wiring material on the electrode of the solar cell in this order and temporarily fixing the wiring material to the solar cell by pressure bonding the wiring material under first temperature condition and first pressurizing condition; an inspection step of inspecting the quality of the temporarily fixed solar cell; a step of removing a solar cell determined to be defective in the inspection step so as to replace the defective solar cell with a non-defective solar cell and temporarily fixing the wiring material to the non-defective solar cell by pressure bonding the wiring material with the resin adhesive interposed therebetween, under the first temperature condition and first pressurizing condition; and a fixing step in which the arrayed solar cells having the wiring materials temporarily fixed thereto and the wiring materials are fixed together by thermally setting the resin adhesive under second temperature condition to apply heat higher than the first temperature condition.

In accordance with another aspect of the invention, a manufacture method for photovoltaic module which includes a step of applying a resin adhesive to an electrode of a solar cell for electrically connecting a wiring material to the electrode, comprises: a step of overlaying the resin adhesive and the wiring material on the electrode of the solar cell in this order and temporarily fixing the wiring material to the solar cell by pressure bonding the wiring material under first temperature condition and first pressurizing condition; an inspection step of inspecting the quality of the temporarily fixed solar cell; a step of removing a solar cell determined to be defective in the inspection step so as to replace the defective solar cell with a non-defective solar cell and temporarily fixing the wiring material to the non-defective solar cell by pressure bonding the wiring material with the resin adhesive interposed therebetween, under the first temperature condition and first pressurizing condition; a step of laminating a plurality of solar cells between a light receiving side surface member and a backside member with a resin sealant, the solar cells temporarily fixed by means of the wiring materials and set in array; and a step in which the solar cells and the wiring materials are fixed together by thermally setting the resin adhesive and curing the resin sealant under a second temperature condition to apply heat higher than the first temperature condition.

An arrangement may be made such that the first temperature condition is to apply heat of 90° C. or below and the second temperature condition is to apply heat of 120° C. or above and 200° C. or below.

According to the invention, the defective solar cell is removed by separating the solar cell from the resin adhesive wherein the resin adhesive component is not thermally set. Therefore, the solar cell can be removed without deforming the wiring material, permitting the reuse of the wiring material. As a result, the productivity improvement and cost reduction can be achieved. What is more, an unwanted heat influence of soldering iron can be eliminated from the repair work.

BRIEF DESCRIPTIN OF THE DRAWINGS

FIG. 9A and FIG. 9B are schematic diagrams each showing repair work for defective solar cell according to the invention;

Figure 1:
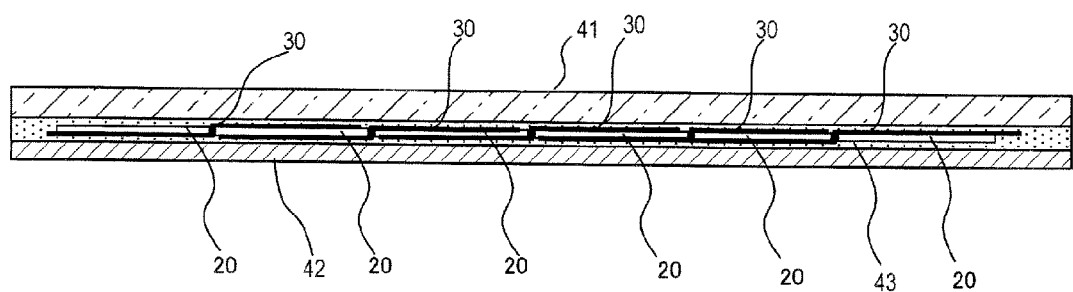
FIG. 1 is a sectional view showing a photovoltaic module manufactured according to the invention.

The foregoing and other objects, features, aspects and advantages of the present invention will become more apparent from the following detailed description of the present invention when reviewed in conjunction with the accompanying drawings.

DETAILED DESCRIPTIN OF THE PREFERRED EMBODIMENETS

A preferred embodiment of the invention will be described in detail with reference to the accompanying drawings. In the drawings the same or similar reference numerals are used to refer to the same or similar components which are explained only once to avoid repetition.

Figure 12:
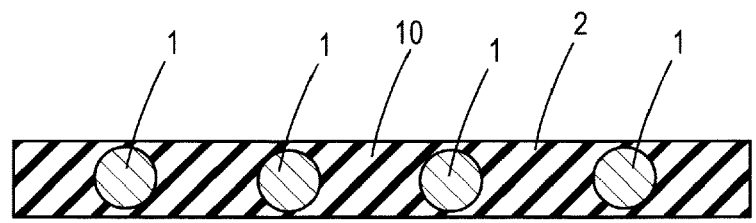
FIG. 12 is a schematic sectional view showing the conductive adhesive film.
Figure 13:
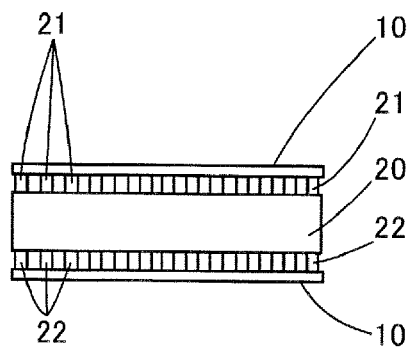
FIG. 13 is a schematic diagram showing one step of a conventional manufacture method for photovoltaic module wherein the electrode of the solar cell and the wiring material are interconnected by means of the conductive adhesive film, the step in which the conductive adhesive film is pasted on the electrode of the solar cell.
Figure 14:
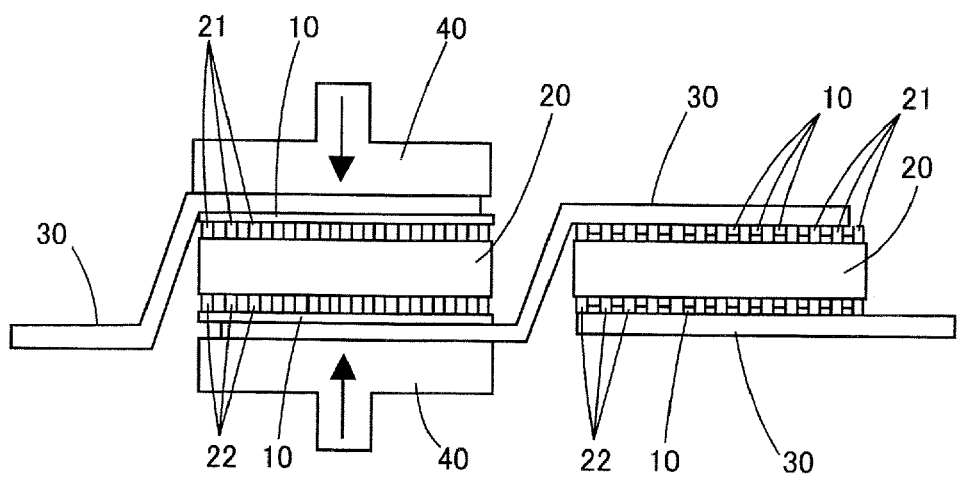
FIG. 14 is a schematic diagram showing one step of the conventional manufacture method for photovoltaic module wherein the electrode of the solar cell and the wiring material are interconnected by means of the conductive adhesive film, the step in which the wiring material is temporarily pressure bonded to the solar cell.
Figure 15:
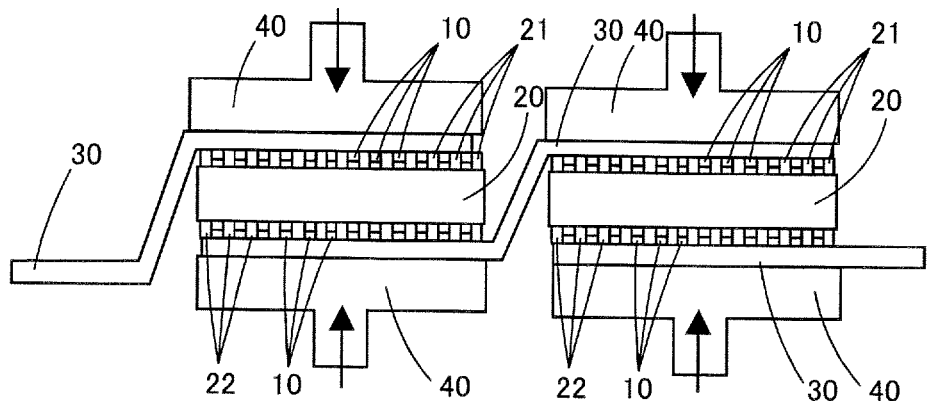
FIG. 15 is a schematic diagram showing one step of the conventional manufacture method for photovoltaic module wherein the electrode of the solar cell and the wiring material are interconnected by means of the conductive adhesive film, the step in which the wiring material is permanently pressure bonded to the solar cell.
Figure 16:
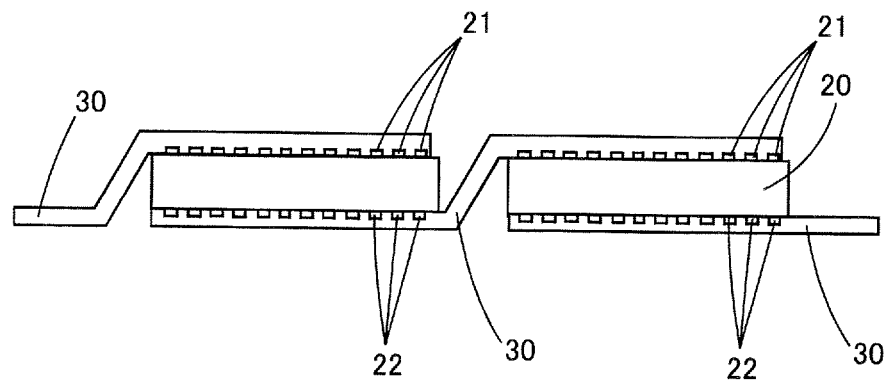
FIG. 16 is a schematic diagram showing one step of the conventional manufacture method for photovoltaic module wherein the electrode of the solar cell and the wiring material are interconnected by means of the conductive adhesive film, or showing a state where the wiring material is fixed to the electrodes of the solar cells.
Figure 17:
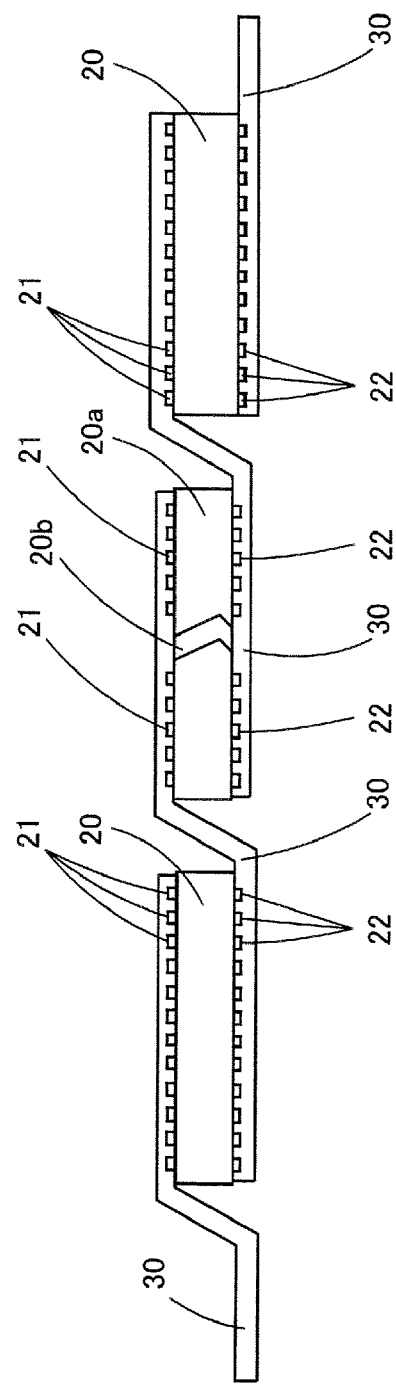
FIG. 17A and FIG. 17B are schematic diagrams each showing repair work for defective solar cell.
Figure 17:
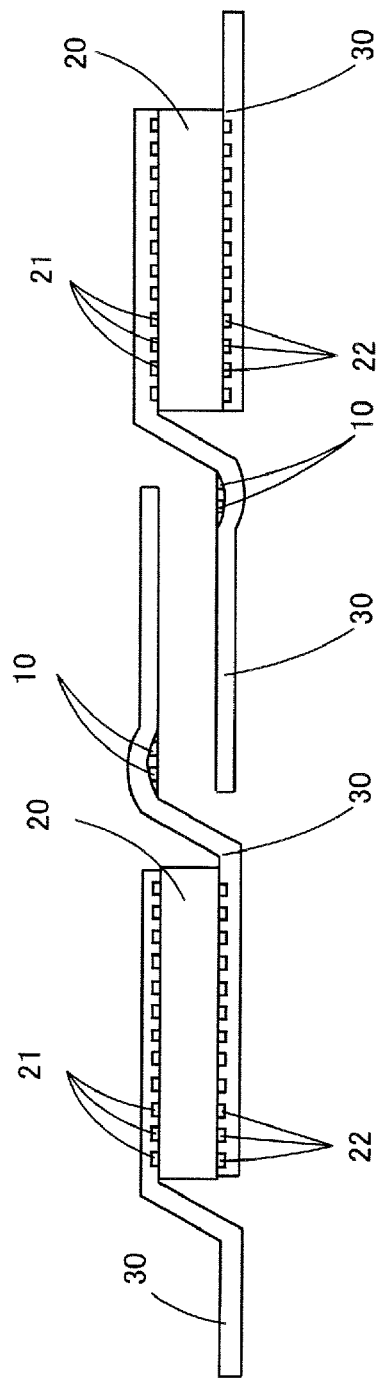
Figure 18:
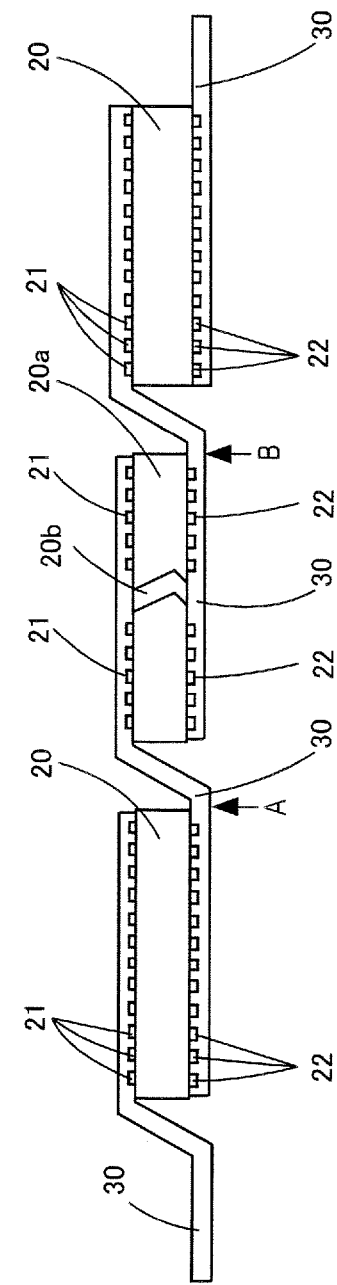
FIG. 18A to FIG. 18C are schematic diagrams each showing the repair work for defective solar cell.
Figure 18:
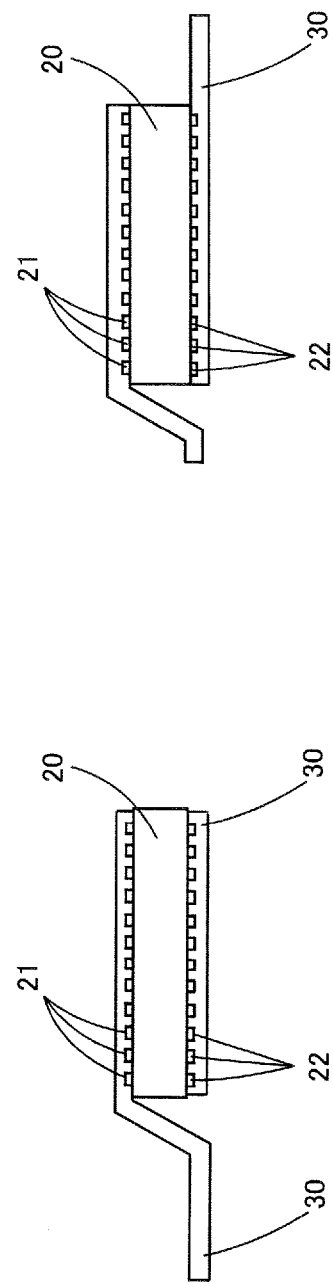
Figure 18:
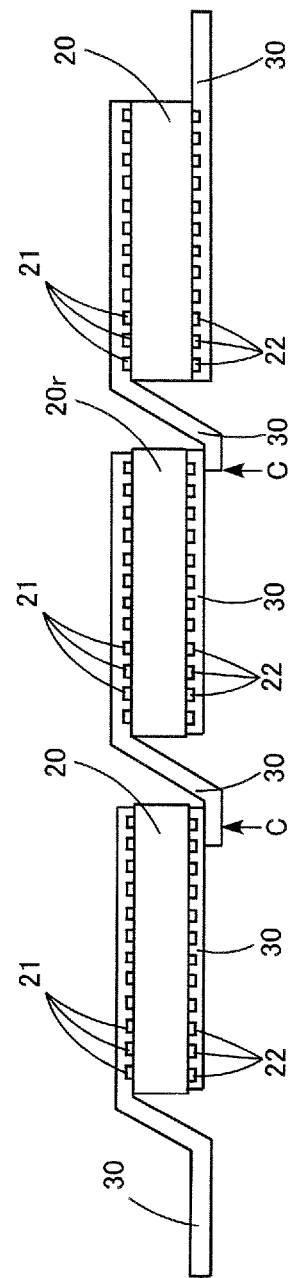

According to the invention, a film adhesive or resin adhesive in paste form may be used as a resin adhesive. In the embodiment, a conductive adhesive film for example is used as the resin adhesive. As shown in a schematic sectional view of FIG. 12, a conductive adhesive film 10 comprises at least a resin adhesive component 2 and conductive particles 1 dispersed therein. The resin adhesive component 2 comprises a composition containing a thermosetting resin. Examples of the usable resin include epoxy resins, phenoxy resins, acrylic resins, polyimide resins, polyamide resins, polycarbonate resins and the like. These thermosetting resins may be used alone or in combination of two or more types. It is preferred to use one or more thermosetting resins selected from the group consisting of epoxy resins, phenoxy resins and acrylic resins.

Examples of usable conductive particles 1 include metal particles such as gold particles, silver particles, copper particles and nickel particles; and conductive particles, such as gold plated particles, copper plated particles and nickel plated particles, which comprise conductive or insulative core particles coated with a conductive layer such as a metal layer.

A solar cell 20 used in a photovoltaic module of the invention comprises, for example, a crystalline semiconductor made of monocrystalline silicon or polycrystalline silicon having a thickness on the order of 0.15 mm and is generally shaped like a square 100 mm or 125 mm on a side. However, the invention is not limited to this and may employ any other solar cell.

An n-type region and a p-type region, for example, are formed in the solar cell 20 while an interfacial area between the n-type region and the p-type region defines a junction for forming an electric field for carrier separation. The n-region and p-region can be formed by using semiconductors for use in solar cell singly or in combination, the semiconductors including crystalline semiconductors such as monocrystalline silicon semiconductors and polycrystalline silicon semiconductors, compound semiconductors such as GaAs and InP, and thin film semiconductors such as thin films Si and CuInSe having an amorphous state or microcrystalline state. For example, the embodiment may employ a solar cell which includes an intrinsic amorphous silicon layer interposed between monocrystalline silicon and amorphous silicon layers having the opposite conductivities so as to reduce defects in interfaces therebetween and to achieve improved heterojunction interface characteristic.

Figure 2:
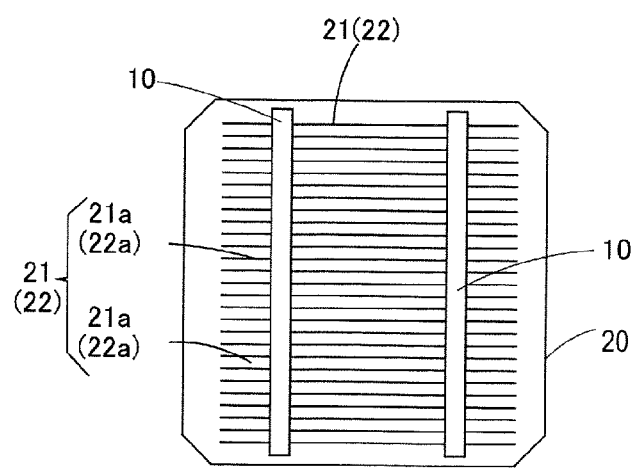
FIG. 2 is a plan view showing a solar cell used in the manufacture method for photovoltaic module according to the invention.
Figure 3:
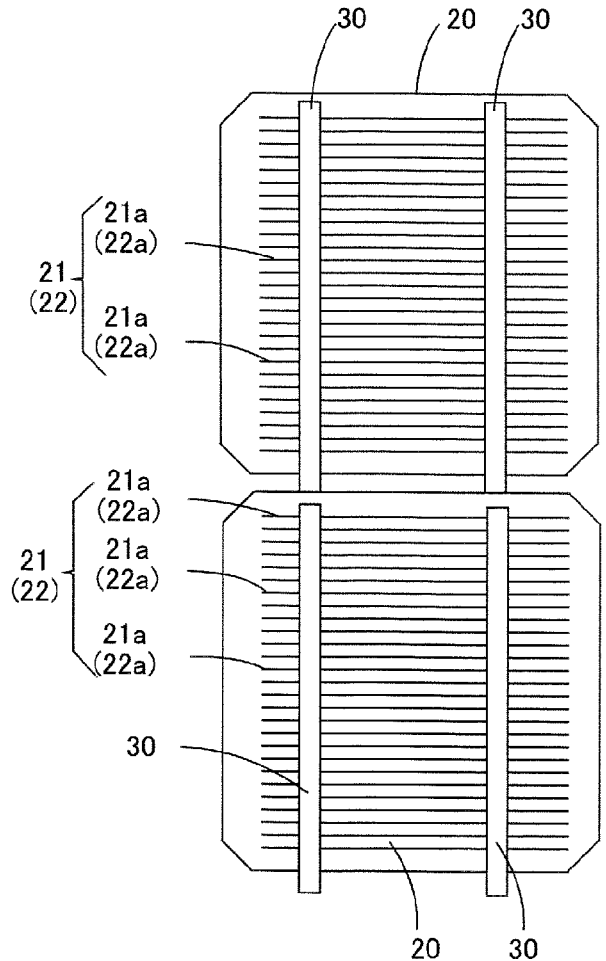
FIG. 3 is a plan view showing the photovoltaic module manufactured according to the invention.

FIG. 1 is a sectional view showing the photovoltaic module manufactured according to the invention. FIG. 2 is a plan view showing a solar cell used in the manufacture method for photovoltaic module according to the invention. FIG. 3 is a plan view showing the photovoltaic module manufactured according to the invention.

As shown in FIG. 1, each of the plural solar cells 20 is electrically connected to its adjoining solar cell(s) 20 by means of a wiring material 30 made of flat copper foil or the like. Specifically, one end of the wiring material 30 is connected to a collector electrode on an upper side of a given solar cell 20 while the other end thereof is connected to a collector electrode on a lower side of another solar cell 20 adjoining the given solar cell 20. These solar cells 20 are connected in series by means of the wiring material 30 so that the photovoltaic module may provide a predetermined output of 200 W, for example, by way of a crossover wiring or lead-out wire.

The plural solar cells 20 are electrically interconnected by means of the wiring material 30 made of the conductor such as copper foil. The solar cells are sealed between a translucent surface member 41 such as glass or translucent plastic and a backside member 42 with a sealing material 43. The backside member comprises a translucent member such as weather-resistant film, glass or translucent plastic. The sealing material comprises a translucent resin sealant such as EVA (ethylene vinyl acetate) having excellent weather resistance and moisture resistance.

As shown in FIG. 2, the above-described solar cell 20 is provided with collector electrodes 21, 22 on front and back sides thereof. The collector electrode 21, 22 includes, for example, a plurality of thin wire electrodes 21a, 22a formed in parallel arrangement. The thin wire electrode 21a, 22a has a width of about 100 μm, a pitch of about 2 mm and a thickness of about 60 μm. Respective sets of about 50 thin wire electrodes 21a, 22a are formed on the front and back sides of the solar cell 20. Such thin wire electrodes 21a, 22a are formed by the steps of, for example, screen printing a silver paste and curing the silver paste at temperatures of a hundred and several tens degrees. The collector electrode 21, 22 may include a bus bar electrode for power collection.

The conductive adhesive films 10 are pasted in parallel on the collector electrodes 21, 22 of the solar cell 20 and are used for electrically connecting the wiring material 30, made of the flat copper foil or the like, with the collector electrodes 21, 22 (see FIG. 3).

Figure 4:
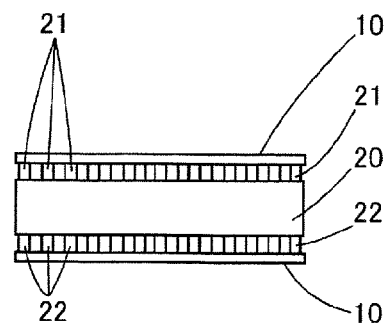
FIG. 4 is a schematic diagram showing one step of the manufacture method for photovoltaic module according to the invention wherein an electrode of the solar cell and a wiring material are interconnected by means of a conductive adhesive film, the step in which the conductive adhesive film is pasted on the electrode of the solar cell.
Figure 5:
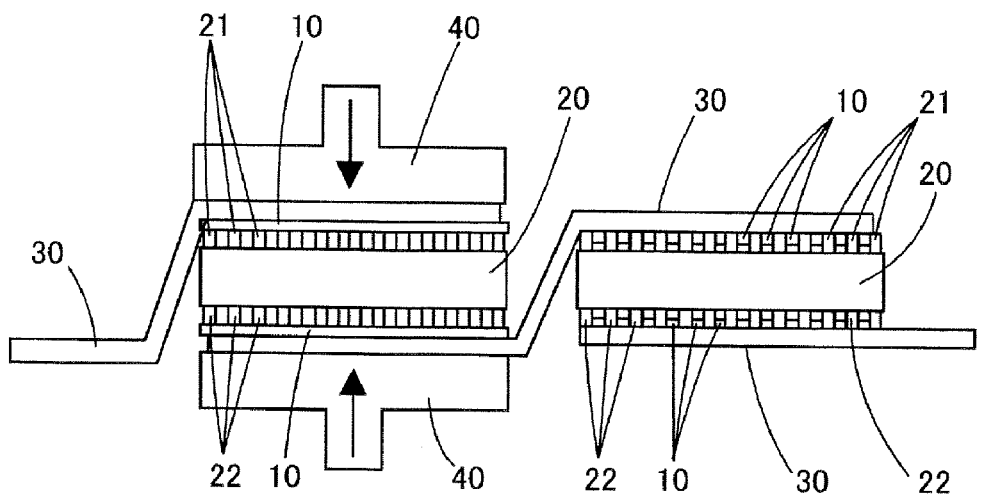
FIG. 5 is a schematic diagram showing one step of the manufacture method for photovoltaic module according to the invention wherein the electrode of the solar cell and the wiring material are interconnected by means of the conductive adhesive film, the step in which the wiring material is temporarily pressure bonded to the solar cell.
Figure 6:
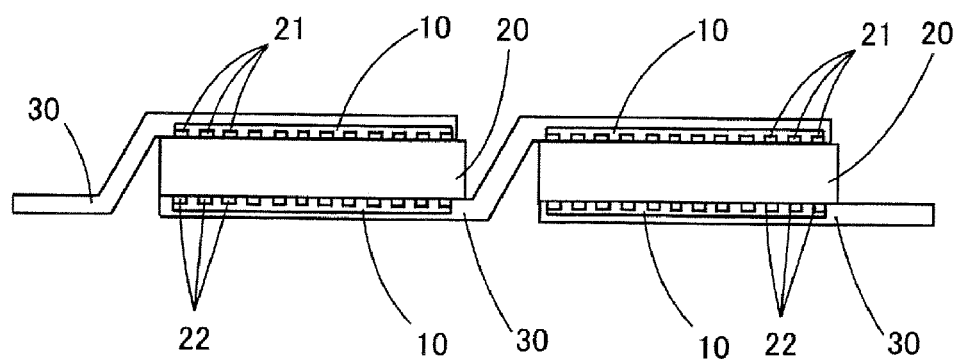
FIG. 6 is a schematic diagram showing one step of the manufacture method for photovoltaic module according to the invention wherein the electrode of the solar cell and the wiring material are interconnected by means of the conductive adhesive film, or showing a state where the wiring material is temporarily pressure bonded to the electrode of the solar cell.
Figure 7:
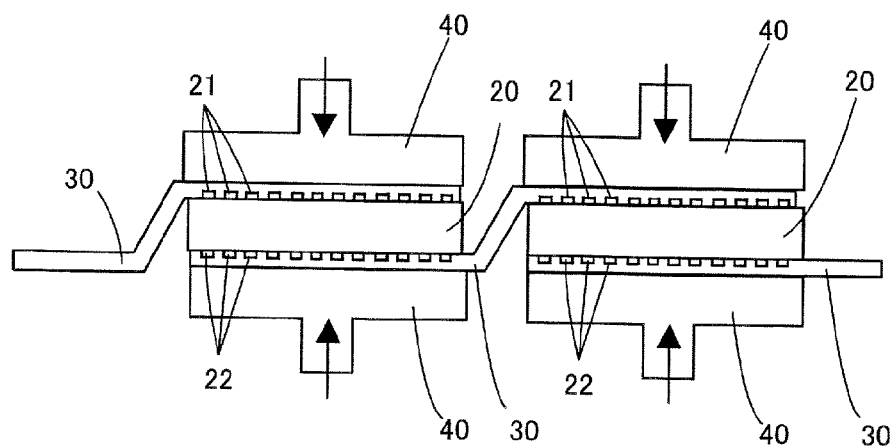
FIG. 7 is a schematic diagram showing one step of the manufacture method for photovoltaic module according to the invention wherein the electrode of the solar cell and the wiring material are interconnected by means of the conductive adhesive film, the step in which the wiring material is permanently pressure bonded to the solar cell.
Figure 8:
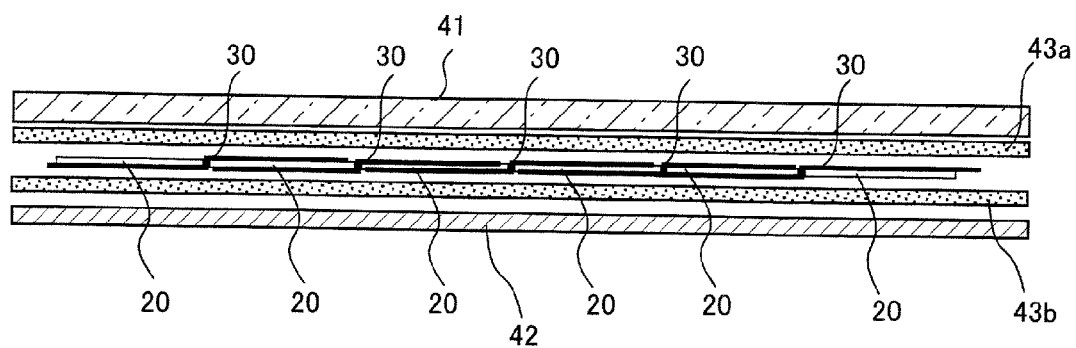
FIG. 8 is a schematic diagram showing the manufacture method for photovoltaic module according to the invention.

Next, description is made on the manufacture method of the invention with reference to FIG. 4 to FIG. 6. FIG. 4 is a schematic diagram showing a step in which the conductive adhesive film is pasted on the electrode of the solar cell. FIG. 5 is a schematic diagram showing a step of temporarily pressure bonding the wiring material to the solar cell. FIG. 6 is a schematic diagram showing a state where the wiring material is temporarily pressure bonded to the electrode of the solar cell. FIG. 7 is a schematic diagram showing a step of permanently pressure bonding the wiring material to the solar cell.

In preparation for electrically connecting the above-described solar cell 20 with the wiring material 30 made of the flat copper foil or the like by means of the conductive adhesive film 10, the conductive adhesive film 10 is first pasted on each of the collector electrodes 21, 22 on the front and back sides of the solar cell 20, as shown in FIG. 4. A resin adhesive component of the conductive adhesive film 10 is a resin adhesive which primarily consists of an epoxy resin and contains a cross-linking promoter such that rapid cross-linking is promoted by heating at 180° C. to set the resin adhesive in 15 seconds or so. This conductive adhesive film 10 has a thickness of 0.01 to 0.05 mm. The width of the conductive adhesive film is preferably equal to or slightly smaller than that of the wiring material 30 in view of the fact that the film may shield the incident light. The embodiment employs a conductive adhesive film in the form of a belt-like film sheet having a width of 1.5 mm and a thickness of 0.02 mm. According to the embodiment, the wiring material 30 is made of the flat copper foil or the like and has a width of 1.5 mm.

As shown in FIG. 5, each of the plural solar cells 20 is electrically connected to its adjoining solar cell(s) 20 by means of the wiring material 30. Specifically, the wiring material 30 is placed on each of the conductive adhesive films 10, 10 pasted on the front and back sides of each solar cell 20 in a manner such that one end of the wiring material 30 is connected to the collector electrode 21 on the upper side of a given solar cell 20 while the other end thereof is connected to the collector electrode 22 on the lower side of another solar cell 20 adjoining the given solar cell 20. The wiring material 30 is temporarily fixed to place by temporarily pressure bonding the wiring material 30 under low temperature, high pressure conditions. The step of temporarily fixing the wiring material is performed as follows. The heater blocks 40, 40 are pressed down on the solar cell 20 at a high pressure of about 2 MPa, for example, so as to press the individual wiring materials 30, 30 against the solar cell 20. The heater blocks 40, 40 are operated at temperatures of about 90° C., for example, for providing low-temperature heating such that the resin adhesive component is not thermally set while the wiring material 30 is temporarily pressure bonded and fixed to place. The solar cells 20, 20 with the wiring materials 30 temporarily fixed thereto are set in array to form a string (see FIG. 6).

In a case where a conductive resin film 10 containing the conductive particles 1 is used, the heater block 40, 40 is used to pressure bond the wiring material 30 to the collector electrode 21 (22) in a manner such that the conductive particles 1 make contact with both the surface of the collector electrode 21 (22) and the surface of the wiring material 30 thereby establishing electrical connection between the collector electrode 21 (22) and the wiring material 30.

The temporary pressure bonding under the low temperature, high pressure conditions applies substantially the same pressure as that used in a conventional step of permanent pressure bonding. Therefore, this step suffers a high incidence of defects of the solar cell 20 such as fracture and cracks attributable to the pressure bonding. The pressure bonding and heating may be accomplished by an optimum method properly selected from a method wherein a metal block incorporating a heater is pressed against the wiring material to apply predetermined pressure and heat and a method wherein a pressing member such as pressure pin and hot air are used to apply the predetermined pressure and heat.

Subsequently, the string wherein the wiring material 30 is temporarily fixed to the solar cells 20, 20 as shown in FIG. 6 is subjected to an inspection step to inspect the quality of the solar cells 20. The inspection step is performed the same way as the conventional finished products inspection. The solar cell string is visually inspected to check for appearance and wiring so as to reject any defective solar cells. As described above, the temporary pressure bonding at high pressure applies substantially the same pressure as that used in the conventional step of permanent pressure bonding. That is, the defective solar cell 20 suffering the fracture or cracks attributable to the pressure bonding is often produced in this step. After the temporary pressure bonding step, therefore, the inspection similar to the finished products inspection is performed to screen out any defective products. The other steps following this step exclude any operation likely to produce the cracks or the like in the solar cell.

If the inspection step detects any defect such as cracks in a solar cell, the string is subjected to a repair step. If the string is determined to be good, the string is subjected to a step of permanently pressure bonding the wiring material.

The step of permanently fixing the wiring material 30 is performed as follows. As shown in FIG. 7, the heater blocks 40, 40 are pressed down on the solar cell 20 at a low pressure of about 0.2 MPa, for example, so as to press the individual wiring materials 30, 30 against the solar cell 20. The temperature of the heater blocks 40, 40 is raised to, for example, 120° C. or above and 200° C. or below, such that high-temperature heating is provided for thermally setting the resin adhesive component thereby permanently pressure bonding and fixing the wiring material 30 to the solar cell. The solar cells 20, 20 are electrically interconnected and set in array by fixing the wiring materials 30 thereto.

The heating temperature is set to 180° C. for example from the viewpoint of throughput and the like. The resin adhesive component is thermally set by 20-second heating thereby electrically and mechanically connecting the collector electrode of the solar cell to the wiring material.

The pressure bonding under the high temperature, low pressure conditions applies substantially the same pressure as that used in the conventional step of temporary pressure bonding.

Therefore, this pressure bonding step has little possibility of producing any defects such as fracture or cracks in the solar cell 20. The pressure bonding and heating may be accomplished by an optimum method properly selected from the method wherein the metal block incorporating the heater is pressed against the wiring material to apply the predetermined pressure and heat and the method wherein the pressing member such as pressure pin and hot air are used to apply the predetermined pressure and heat.

While the above embodiment uses the conductive resin film as the resin film, a resin film free from the conductive particles may also be used. In a case where a resin adhesive free from the conductive particles is used, the electrical connection is established by partially placing the surface of the collector electrode 21 (22) in direct contact with the surface of the wiring material 30. It is preferred in this case that the wiring material 30 comprises a soft conductive film of tin (Sn), solder or the like formed on the surface of the conductor such as copper foil and the conductive film is softer than the collector electrode 21 (22) so as to allow the collector electrode 21 (22) to be partially embedded in and connected to the conductive film.

The string of plural solar cells 20 interconnected by means of the wiring material 30 is sandwiched between translucent sealing sheets 43a, 43b such as EVA sheet and laminated between the surface member 41 made of glass and the backside member 42 made of the translucent member such as weather-resistant film, glass or translucent plastic. Next, a laminator is used to seal the solar cells 20 between the surface member 41 and the backside member 42 with the sealing sheets 43a, 43b. Subsequently, the resultant laminate is placed in a furnace and allowed to cure through cross-linking reaction at about 150° C. for 10 minutes whereby adhesiveness between the sealing material 43 (sealing sheets 43a, 43b) and the surface member 41/the backside member 42 is increased. Thus is fabricated the photovoltaic module shown in FIG. 1.

If any defective solar cell is detected in the inspection step, the operation proceeds to the repair step. In the repair step, as shown in FIG. 9A, the solar cell 20a suffering the facture or crack 20b is removed so as to be replaced by a non-defective solar cell 20r. For this purpose, the target solar cell 20a temporarily pressure bonded to the wiring material 30 is separated and removed from the wiring material 30. At this time, the resin adhesive component is not thermally set and hence, the bonding strength between the solar cell 20a and the conductive adhesive film 10 is low. Accordingly, the solar cell 20a can be removed from the wiring material 30 without deforming the wiring material 30, which can be reused.

As shown in FIG. 9B, the replacing solar cell 20r having the conductive adhesive films 10 pasted on the collector electrodes 21, 22 on the front and back sides thereof is prepared and is placed at place between the wiring materials 30, from which the solar cell 20a is removed. The same step as that shown in FIG. 5 is performed to temporarily pressure bond and fix the wiring material 30 to the solar cell under the low temperature, high pressure conditions. Subsequently, the finished products inspection is performed. If the solar cell is determined to be good in this inspection step, the operation proceeds to the step of permanently pressure bonding the wiring material 30.

The step of permanently pressure bonding and fixing the wiring material 30 is performed as shown in FIG. 7. In the permanent pressure bonding/fixing step, the heater blocks 40, 40 are pressed down on the solar cell at a low pressure of about 0.2 MPa, for example, so as to press the individual wiring materials 30, 30 against the solar cell 20. The temperature of the heater blocks 40, 40 is raised to, for example, 120° C. or above and 200° C. or below, such that high-temperature heating for thermally setting the resin adhesive component is provided thereby permanently pressure bonding and fixing the wiring material 30 to the solar cell. The solar cells 20, 20 are electrically interconnected and set in array by fixing the wiring material 30 thereto. Thus is obtained a string finished with the repair work. The string is sandwiched between the translucent sealing sheets 43a, 43b such as EVA sheet and laminated between the surface member 41 made of glass and the backside member 42 made of the translucent member such as weather-resistant film, glass or transparent plastic. Next, the laminator is used to seal the solar cells 20 between the surface member 41 and the backside member 42 with the sealing sheets 43a, 43b. Subsequently, the laminate is placed in the furnace and allowed to cure through cross-linking reaction at about 150° C. for 10 minutes whereby the adhesiveness between the sealing material 43 (sealing sheets 43a, 43b) and the surface member 41/the backside member 42 is increased. Thus is fabricated the photovoltaic module shown in FIG. 1

Next, description is made on another embodiment of the invention. According to the above-described embodiment, the wiring material 30 is pressure bonded and fixed to the solar cell 20 by the permanent pressure bonding step, which is followed by the laminating step and laminate curing step.

The permanent pressure bonding step according to the invention is to thermally set the resin adhesive component under the high temperature, low pressure conditions. Hence, this step can serve the dual purposes of thermally setting the resin adhesive component and curing the sealing material.

Figure 10:
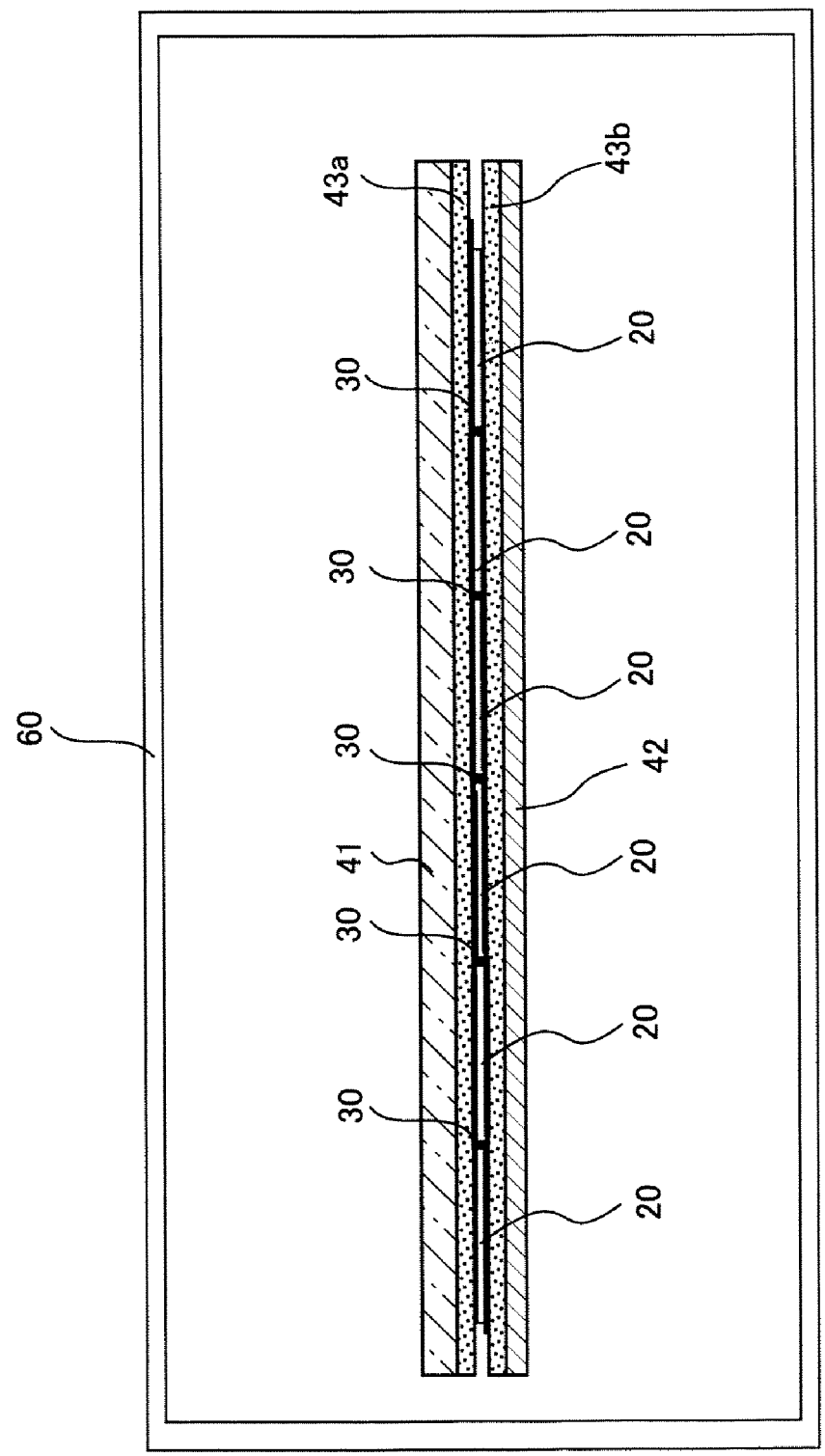
FIG. 10 is a schematic diagram showing a step of a manufacture method for photovoltaic module according to another embodiment of the invention.
Figure 11:
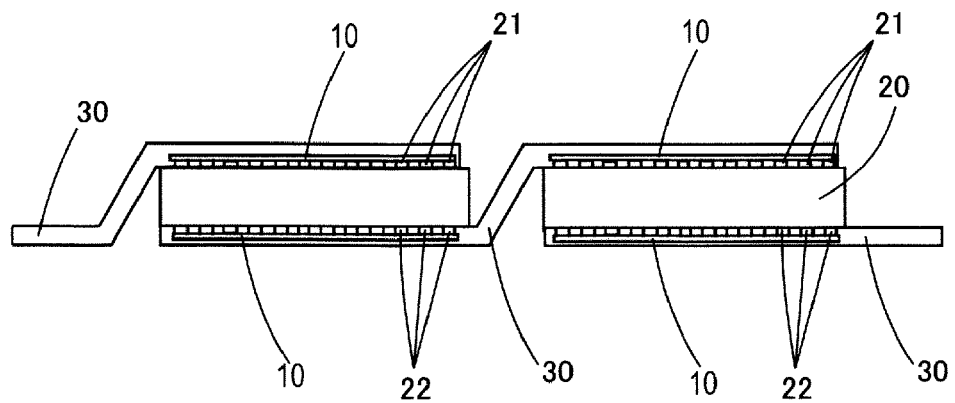
FIG. 11 is a schematic diagram showing the photovoltaic module wherein the electrode of the solar cell and the wiring material are interconnected by means of the conductive adhesive film.

A step is performed in which an array of solar cells 20 temporarily fixed by means of the wiring material 30 is sandwiched between weather-resistant resin materials and laminated between a light receiving side surface member and a backside member. Subsequently, as shown in FIG. 10, the photovoltaic module through the laminating step is placed in a furnace 60 and heat treated in a manner such that the conductive adhesive film 10 is thermally set under high temperature, low pressure conditions so as to pressure bond/fix the wiring materials 30 to the solar cells 20 and to cure the sealing material. In this step, the furnace 60 has the heating temperature set to 150° C., for example, and heat treats the photovoltaic module for 5 to 10 minutes thereby serving the dual purposes of thermally setting the resin adhesive component and curing the sealing material.

It should be understood that the embodiments disclosed herein are to be taken as examples in every point and are not limited. The scope of the present invention is defined not by the above described embodiments but by the appended claims. All changes that fall within means and bounds of the claims or equivalence of such means and bounds are intended to be embraced by the claims.

The invention claimed is:

1. A manufacture method for photovoltaic module which includes a step of applying a resin adhesive to an electrode of a solar cell for electrically connecting a wiring material to the electrode, comprising:
   a step of overlaying the resin adhesive and the wiring material on the electrode of the solar cell in this order and temporarily fixing the wiring material to the solar cell by pressure bonding the wiring material under first temperature condition and first pressurizing condition;
   an inspection step of inspecting the quality of the temporarily fixed solar cell;
   a step of removing a solar cell determined to be defective in the inspection step so as to replace the defective solar cell with a non-defective solar cell and temporarily fixing the wiring material to the non-defective solar cell by pressure bonding the wiring material with the resin adhesive interposed therebetween, under the first temperature condition and first pressurizing condition; and
   a fixing step in which the arrayed solar cells having the wiring materials temporarily fixed thereto and the wiring materials are fixed together by thermally setting the resin adhesive under second temperature condition to apply heat higher than the first temperature condition and a predetermined pressurizing condition.

2. The manufacture method for photovoltaic module according to claim 1, wherein the pressurizing condition of the fixing step is to apply pressure lower than the first pressuring condition.

3. The manufacture method for photovoltaic module according to claim 1, wherein the first temperature condition is to apply heat of 90° C. or below and the second temperature condition is to apply heat of 120° C. or above and 200° C. or below.

4. A manufacture method for photovoltaic module which includes a step of applying a resin adhesive to an electrode of a solar cell for electrically connecting a wiring material to the electrode, comprising:
 a step of overlaying the resin adhesive and the wiring material on the electrode of the solar cell in this order and temporarily fixing the wiring material to the solar cell by pressure bonding the wiring material under first temperature condition and first pressurizing condition;
 an inspection step of inspecting the quality of the temporarily fixed solar cell;
 a step of removing a solar cell determined to be defective in the inspection step so as to replace the defective solar cell with a non-defective solar cell and temporarily fixing the wiring material to the non-defective solar cell by pressure bonding the wiring material with the resin adhesive interposed therebetween, under the first temperature condition and first pressurizing condition;
 a step of laminating a plurality of solar cells between a light receiving side surface member and a backside member with a resin sealant, the solar cells temporarily fixed by means of the wiring materials and set in array; and
 a step in which the solar cells and the wiring materials are fixed together by thermally setting the resin adhesive and curing the resin sealant under a second temperature condition to apply heat higher than the first temperature condition.

5. The manufacture method for photovoltaic module according to claim 4, wherein the first pressurizing condition is to press the wiring material against the resin adhesive at a pressure of 2MPa.

6. The manufacture method for photovoltaic module according to claim 4, wherein the first temperature condition is to apply heat of 90° C. or below and the second temperature condition is to apply heat of 120° C. or above and 200° C. or below.

* * * * *